United States Patent [19]

Link

[11] Patent Number: 4,918,591
[45] Date of Patent: Apr. 17, 1990

[54] HIGH FREQUENCY INTERFERENCE SUPPRESSION FILTER FOR CIRCUITS TO BE CONNECTED TO A CONDUCTOR

[75] Inventor: Walter Link, Rutesheim, Fed. Rep. of Germany

[73] Assignee: Euchner & Co., Fed. Rep. of Germany

[21] Appl. No.: 245,373

[22] Filed: Sep. 16, 1988

[30] Foreign Application Priority Data

Sep. 18, 1987 [DE] Fed. Rep. of Germany ....... 3731394

[51] Int. Cl.$^4$ .............................................. H03H 7/06
[52] U.S. Cl. ........................................ 363/39; 333/32; 333/167
[58] Field of Search ................... 363/39; 333/17.3, 32, 333/167, 172, 33

[56] References Cited

U.S. PATENT DOCUMENTS 2,957,944 10/1960 De Monte ............................. 333/32
4,794,353 12/1988 Broyde ................................ 333/167

FOREIGN PATENT DOCUMENTS 2740112 3/1979 Fed. Rep. of Germany ........ 333/32
2830957 4/1982 Fed. Rep. of Germany .
0074809 4/1985 Japan ..................................... 333/172
1119374 5/1970 United Kingdom .

Primary Examiner—Patrick R. Salce
Assistant Examiner—Kristine Peckman
Attorney, Agent, or Firm—Wigman & Cohen

[57] ABSTRACT

In a high frequency interference suppression filter for a circuit to be connected to a conductor, particularly two-wire sensors having at least one inductor in series with the circuit to be protected from interference and having at least one capacitor parallel to this circuit, an ohmic series resistor is provided which is matched to the characteristic impedance of the conductor.

10 Claims, 1 Drawing Sheet

HIGH FREQUENCY INTERFERENCE SUPPRESSION FILTER FOR CIRCUITS TO BE CONNECTED TO A CONDUCTOR

BACKGROUND OF THE INVENTION

This invention relates to a high frequency interference suppression filter for a circuit to be connected to a conductor, particularly for double-wire sensors having the characteristics in the preamble of claim 1.

The known high frequency interference suppression filters are of such size that the mismatching between the filter and conductor is as great as possible. The effect of an interference suppression filter of this type is inadequate in many instances, for example when a radiotelephone is in operation in the vicinity of the conductor.

SUMMARY OF THE OBJECTS OF THE INVENTION

The object of the invention is to create a high frequency interference suppression filter that has an improved interference suppression effect as compared to the known embodiments. This object is achieved by a high frequency interference suppression filter having the characteristics of claim 1.

By means of the ohmic series resistance R and its matching (R=Z) to the characteristic impedance Z of the conductor, the high frequency power fed from the interference source into the conductor is destroyed in the series-arm branch. Therefore, in contrast to interference with the known interference suppression filters, it no longer matters how far the feed of the high frequency energy is spaced in the conductor from the interference suppression filter. Because conductor reflections and conductor resonances are also prevented, and in addition a transformation of the terminal resistance can no longer occur, such as might correspond to a short circuit or no-load conditions with a proximity switch, depending on the switch condition, there is also the further advantage that the interference suppression effect arising from a change in the terminal resistance, i.e., a change in the switch condition of a sensor, ir not altered. Furthermore, the source-side terminal resistance, which is often not even known, no longer needs to be taken into account in the sizing of the interference suppression filter.

An optimal interference suppression behaviour is obtained with a symmetrical embodiment of the interference suppression filter. With a conductor with two lines, this is accomplished by means of a division of the ohmic series resistance into two partial resistances, the resistance values of which each correspond to half of the characteristic impedance, and an arrangement of each of these two partial resistances in series with the two lines of the conductor. In a conductor having three lines or two lines and a protection line, the ohmic series resistances should be divided into three partial resistances to achieve complete symmetry. The resistance value of each of these three partial resistances, each of which is connected in series with one of the lines, is also equal to half of the characteristic impedance.

The ohmic series resistance or its partial resistances are advantageously connected in parallel to the inductor or its partial inductors, so that the supply voltage to the subsequent circuit, which can be a direct current voltage or a low frequency voltage, and also the signals that are delivered from a sensor conducted via the conductor, can be passed through the inductor with practically no damping. The inductors are of such dimensions that they provide a very low impedance value for the supply voltage and, where appropriate, for the signals to be conducted; they have a very high impedance value for the high frequency interference.

Preferably, the ohmic series resistance is connected in series with the parallel circuit of the capacitor and the circuit to be protected. If the conductor has more than two wires, then it is also advantageous to provide a symmetry for these capacitors. The capacitor or the capacitors are of such dimensions that they have a very high impedance fo rlow frequency voltages and signals, and a very low impedance for the high frequency interference.

With the foregoing and other objects, advantages and features of the invention that will become hereinafter apparent, the nature of the invention may be more clearly understood by reference to the following detailed description of the invention, the appended claims and to the several views illustrated in the attached drawings.

DETAILED DESCRIPTION OF THE PREFERRED EMBODIMENTS

Figure 1:
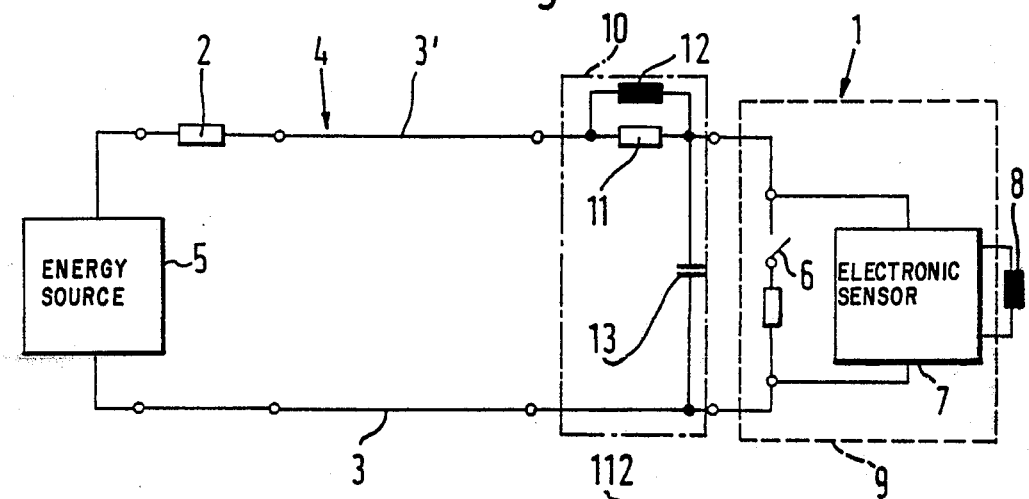
FIG. 1 is a first exemplary embodiment for conductor having two lines in the installed condition.

A noncontact, inductive proximity swith 1, which switches on and off a load 2, is connected with one pole of an energy source 5 by a first line 3 of a connecting conductor 4, which energy source delivers a direct current voltage or a low frequency alternating voltage. A connector of the load 2 is connected with the other pole of the energy source 5. Its other connector is connected with the second connector of the proximity switch 1 via the second line 3' of the connecting conductor 4.

The proximity switch 1, which is formed in a known manner, contains a mechanical or electrical switch 6 as well as an electronic sensor 7 and inductive means 8 connected thereto. The switch 6 and the electronic sensor 7 are shielded and protected in a metal housing 9.

In order to prevent an antenna, such as that of a radiotelephone from introducing high frequency interference into the two lines 3 and 3' of the connecting conductor 4 and disrupting the proximity switch 1 or making it incapable of functioning, a high frequency interference suppression filter designating generally with the numeral 10 is connected between the two connectors of the proximity switch 1 and the end of the connecting conductor 4 to be connected therewith. As shown in FIG. 1, this interference suppression filter 10 has an ohmic series resistor 11, which in the exemplary embodiment lies between one end of the line 3' and one connector of the proximity switch 1, but could also be connected in series with the second line 3. The resistance value of the series resistor 11 is equal to the characteristic impedance of the connecting conductor 4. This has the result that the high frequency energy fed from an antenna is destroyed in the series resistor 11. It therefore does not matter at what point in the connecting conductor 4 the antenna is located and how great its distance is from the connecting conductor 4.

To assure that the energy transferred from the energy source 5, which can be a source for an alternating current voltage or a direct current voltage, to the proximity switch 1 can pass by the ohmic series resistor 11 with practically no loss, inductor 12 is connected thereto in parallel. This inductor 12 also has an extremely low impedance for the signals of the proximity switch 1, and a very high impedance for the high frequency interference. In addition, a condensor 13 is arranged parallel to the two connections of the proximity switch 1, which condensor 13 has an extremely low impedance for the high frequency interference and has a very high impedance for the supplied voltage of the proximity switch 1 and its signals. As shown in FIG. 1, the ohmic series resistor 11 lies in series with the parallel circuit formed from the condensor 13 and the proximity switch 1.

Figure 2:
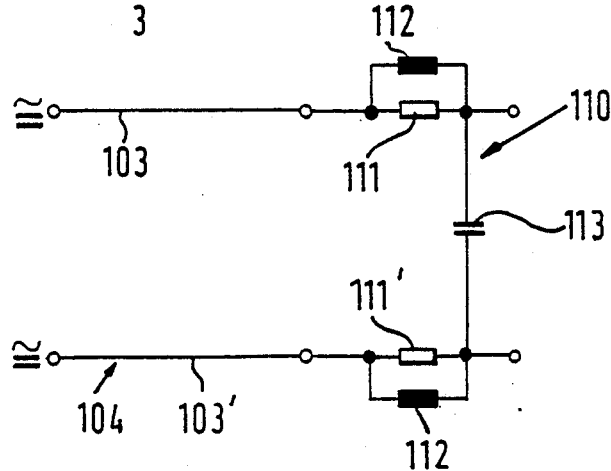
FIG. 2 is a modified embodiment for a conductor having two lines.

An optimal interference suppression is obtained when the high frequency interference suppression filter has a symmetrical construction, as is the case in the exemplary embodiment according to FIG. 2. With this interference suppression filter, designated generally by the numeral 110, for a conductor 104 having only two lines 103 and 130', the ohmic series resistor is divided into two equal partial resistors 111 and 111', the resistance value of which is selected to be equal to half of the characteristic impedance of the conductor 104. Respective inductors 112 are connected in parallel with the two partial resistors 111 and 111', which inductors each are the same size and have the same dimensions as the inductor 12 of the first exemplary embodiment. A condensor 113 is arranged like, and has the same dimensions as that in, the exemplary embodiment according to FIG. 1.

Figure 3:
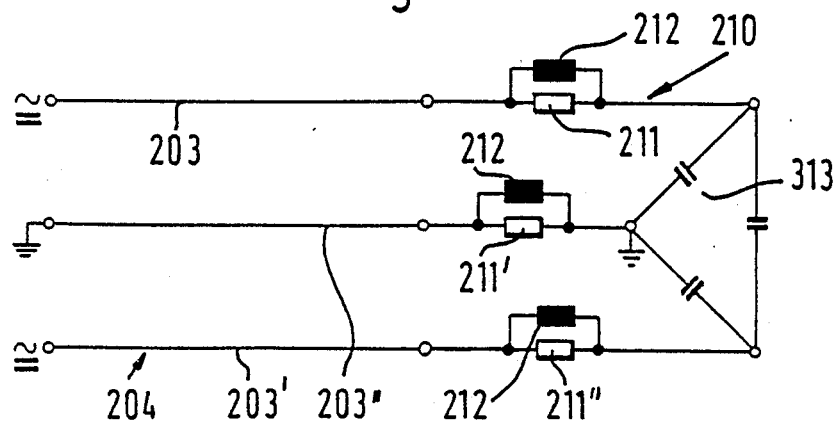
FIG. 3 is an exemplary embodiment for a conductor having three lines.

If the conductor 204 has three lines, two voltage conducting lines 203 and 203' and a protective line 203", an optimal interference suppression effect is also obtained if the interference suppression filter designated generally with the numeral 210 has a symmetrical construction. This means, as shown in FIG. 3, that a partial resistor 211, 211', 211" is connected in series with each of the three conductors 203, 203' and 203", and the resistance values thereof are equal to half of the characteristic impedance of the conductor 204. Respective inductors 212 are connected in parallel to these partial resistors 211, 211' and 211", all of which have dimensions corresponding to the inductor 12 of the first exemplary embodiment. The three outputs of the interference suppression filter 210 are connected with each other by respective condensors 313, all of which are identical and have dimensions corresponding to the condensor 13 of the first exemplary embodiment.

All of the characteristics mentioned in the above specification as well as those that can be obtained only from the illustration are components of the invention as additional embodiments, even if they are not particularly emphasized and not separately mentioned in the claims.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A high frequency interference suppression filter for a circuit to be connected to a conductor comprising inductor means in series with the circuit to be protected from interference, at least one capacitor connected in parallel to the circuit, and an ohmic series resistor connected in parallel to the inductor means whose value is set to the characteristic impedance of the conductor.

2. A filter according to claim 1, wherein the conductor has two lines and the ohmic series resistor is divided into two partial resistors with respective resistance values equal to half of the characteristic impedance, said partial resistors connected in series with each of the two conductor lines.

3. A filter according to claim 1, wherein the conductor has three lines consisting of two lines and a protective line, the ohmic series resistor is divided into three partial resistors each having half of the characteristic impedance of the conductor, and each of the three lines is connected in series with one of the three partial resistors.

4. A filter according to claim 1, wherein the ohmic series resistor is connected in parallel with the inductor means.

5. A filter according to claim 4, wherein the inductor means is selected such that it has a very low impedance for the supply voltage of the circuit and for signals of the circuit and has a very high impedance for a high frequency.

6. A filter according to claim 1, wherein the ohmic series resistor is connected in series with the parallel circuit formed by the capacitor and the circuit.

7. A filter according to claim 6, wherein the capacitor is selected such that it has a very high impedance for the supply voltage of the circuit an signals of the circuit and has a very low impedance for high frequencies.

8. A filter according to claim 2 wherein each of said partial resistors is connected in parallel with said inductor means.

9. A filter according to claim 3 wherein each of said partial resistors is connected in parallel with said inductor means.

10. A filter according to claim 8 wherein said inductor means comprises a number of inductors equalling the number of said partial resistors and wherein each said partial resistor is connected in parallel with a respective one of said inductors.

* * * * *